US011588337B2

(12) United States Patent
Wu et al.

(10) Patent No.: US 11,588,337 B2
(45) Date of Patent: Feb. 21, 2023

(54) CENTRALIZED CHARGING CABINET PROVIDED WITH ISOLATION AREA AND CHARGING AREA

(71) Applicant: Delta Electronics (Shanghai) Co., Ltd., Shanghai (CN)

(72) Inventors: Hongyang Wu, Shanghai (CN); Jian Zhu, Shanghai (CN); Liping Sun, Shanghai (CN); Chao Yan, Shanghai (CN); Qianfeng Li, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 215 days.

(21) Appl. No.: 16/851,089

(22) Filed: Apr. 16, 2020

(65) Prior Publication Data

US 2020/0335989 A1    Oct. 22, 2020

(30) Foreign Application Priority Data

Apr. 18, 2019  (CN) .......................... 201910314551.8
Dec. 6, 2019   (CN) .......................... 201911244784.1

(51) Int. Cl.
*H02J 7/00*       (2006.01)
*B60L 53/60*      (2019.01)
(Continued)

(52) U.S. Cl.
CPC .......... *H02J 7/0045* (2013.01); *B60L 53/302* (2019.02); *B60L 53/305* (2019.02); *B60L 53/60* (2019.02);
(Continued)

(58) Field of Classification Search
CPC .... H02J 7/0045; H02J 7/00032; H02J 7/0047; B60L 53/60; B60L 53/302; B60L 53/305; B60L 53/30; B60L 53/20; B60L 53/22
(Continued)

(56) References Cited

U.S. PATENT DOCUMENTS 10,131,239 B2 * 11/2018 Herke ..................... B60L 53/14
2011/0234020 A1 *  9/2011 Lai ........................... H02H 3/14
                                                          307/326
(Continued)

FOREIGN PATENT DOCUMENTS

CN      200947557 Y      9/2007
CN      101170284 A      4/2008
(Continued)

OTHER PUBLICATIONS

Corresponding extended European search report dated Jul. 30, 2020.
(Continued)

*Primary Examiner* — Nathaniel R Pelton
(74) *Attorney, Agent, or Firm* — CKC & Partners Co., LLC

(57) ABSTRACT

The present disclosure provides a centralized charging cabinet, including: a charging cabinet, provided with an isolation area and a charging area therein; an isolation transformer, provided in the isolation area; and at least one charging unit, provided in the charging area, where each of the charging unit is electrically connected to a secondary winding of the isolation transformer through a plurality of first connection structures, and the plurality of first connection structures are located at a back region of the charging area. In the centralized charging cabinet, the isolation transformer is provided in the isolation area inside the charging cabinet, the charging unit is provided in the charging area inside the charging cabinet, which realizes a centralized layout of the isolation transformer and the charging unit and improves the space utilization.

14 Claims, 16 Drawing Sheets

(51) Int. Cl.
*B60L 53/302* (2019.01)
*B60L 53/30* (2019.01)
*H05K 7/20* (2006.01)

(52) U.S. Cl.
CPC ........ *H02J 7/00032* (2020.01); *H02J 7/0047* (2013.01); *H05K 7/20172* (2013.01); *H05K 7/20909* (2013.01)

(58) Field of Classification Search
USPC .......................................................... 320/107
See application file for complete search history.

(56) References Cited

U.S. PATENT DOCUMENTS

| | | | |
|---|---|---|---|
| 2012/0068663 A1 | 3/2012 | Tanikawa et al. | |
| 2013/0020989 A1* | 1/2013 | Xia ................... | H02M 7/2176 320/109 |
| 2015/0372499 A1 | 12/2015 | Purcarea et al. | |
| 2016/0211689 A1 | 7/2016 | Shenny et al. | |
| 2017/0077698 A1* | 3/2017 | Liu .......................... | H02J 1/00 |
| 2018/0290548 A1 | 10/2018 | Kalkmann et al. | |

FOREIGN PATENT DOCUMENTS

| | | |
|---|---|---|
| CN | 101286639 A | 10/2008 |
| CN | 101673964 B | 8/2011 |
| CN | 201956919 U | 8/2011 |
| CN | 102280881 A | 12/2011 |
| CN | 202094811 U | 12/2011 |
| CN | 102545221 A | 7/2012 |
| CN | 102738810 A | 10/2012 |
| CN | 103023043 A | 4/2013 |
| CN | 203326858 U | 12/2013 |
| CN | 204577931 U | 8/2015 |
| CN | 204928282 U | 12/2015 |
| CN | 103532158 B | 1/2016 |
| CN | 205509651 U | 8/2016 |
| CN | 105932893 A | 9/2016 |
| CN | 106230262 A | 12/2016 |
| CN | 107394803 A | 11/2017 |
| CN | 107706797 A | 2/2018 |
| CN | 207274432 U | 4/2018 |
| CN | 108011306 A | 5/2018 |
| CN | 109617424 A | 4/2019 |
| EP | 2907227 A2 | 8/2015 |

OTHER PUBLICATIONS

Corresponding China Office Action dated Jul. 15, 2021.
Corresponding China Office Action dated Aug. 2, 2021.
The Office Action of U.S. Appl. No. 16/851,073 dated Feb. 4, 2022.
Corresponding U.S. office action dated Dec. 15, 2022.

* cited by examiner

CENTRALIZED CHARGING CABINET PROVIDED WITH ISOLATION AREA AND CHARGING AREA

CROSS-REFERENCE TO RELATED APPLICATIONS

The present application claims priority to Chinese patent application No. 201911244784.1, filed on Dec. 6, 2019 and Chinese Patent Application No. 201910314551.8, filed on Apr. 18, 2019, which are incorporated by reference in their entireties.

TECHNICAL FIELD

The present disclosure relates to the technical field of electric vehicles, in particular, to a centralized charging cabinet.

BACKGROUND

With the increasingly serious environmental problems, many countries around the world have formulated policies to support the development of electric vehicles, and the supporting electric vehicles charging system has also been continuously improved.

FIG. 1 is a schematic structural diagram of a charging system in the prior art. As shown in FIG. 1, the charging system includes a power distribution station, a switch box, and a charging equipment, where a 10 kV high-voltage power is connected to a 10 kV switch box, and the 10 kV switch box is connected to a 10 kV/0.4 kV power distribution station through a connection line. The power distribution station includes a plurality of transformers, the charging equipment includes a plurality of rectifying units, the transformers are connected to the rectifying unit in one-to-one correspondence, an output of the rectifying unit charges an electric vehicle through a charging gun. An automatic display and a control apparatus are also provided in the charging system.

However, in the above charging system, the rectifying equipment, the power distribution station, and the control apparatus adopt a distributed arrangement, thus the space utilization is low.

SUMMARY

The present disclosure provides a centralized charging cabinet, in order to solve the problem of low space utilization caused by the distributed arrangement of the rectifying equipment, the power distribution station and the control apparatus in the existing charging system.

The present disclosure provides a centralized charging cabinet, including: a charging cabinet, provided with an isolation area and a charging area therein; an isolation transformer, provided in the isolation area; and at least one charging unit, provided in the charging area, where each of the charging unit is electrically connected to a secondary winding of the isolation transformer through a plurality of first connection structures, and the plurality of first connection structures are located at a back region of the charging area.

In the centralized charging cabinet provided by the present disclosure, the isolation transformer is provided in the isolation area inside the charging cabinet, the charging unit is provided in the charging area inside the charging cabinet, which realizes a centralized layout of the isolation transformer and the charging unit and improves the space utilization. Disposing the charging unit in the charging cabinet can reduce a design requirement of a casing of the charging unit. In addition, dividing the charging area into the back region and the front region, and disposing a power line connecting the isolation transformer and the charging unit in the back region, thereby achieving high-voltage area isolation and improving safety of the centralized charging cabinet.

DETAILED DESCRIPTION OF THE EMBODIMENTS

In order to more clearly illustrate embodiments of the present disclosure or technical solutions in the prior art, accompanying drawings required for describing the embodiments or the prior art will be briefly described below. Obviously, the accompanying drawings in the following description are some of the embodiments of the present disclosure, and other drawings can be obtained by those skilled in the art based on these accompanying drawings without any creative effort.

The present disclosure provides a centralized charging cabinet which can solve the problem of low space utilization caused by the distributed arrangement of the rectifying equipment, the power distribution station and the control apparatus in the existing charging system.

Figure 1:
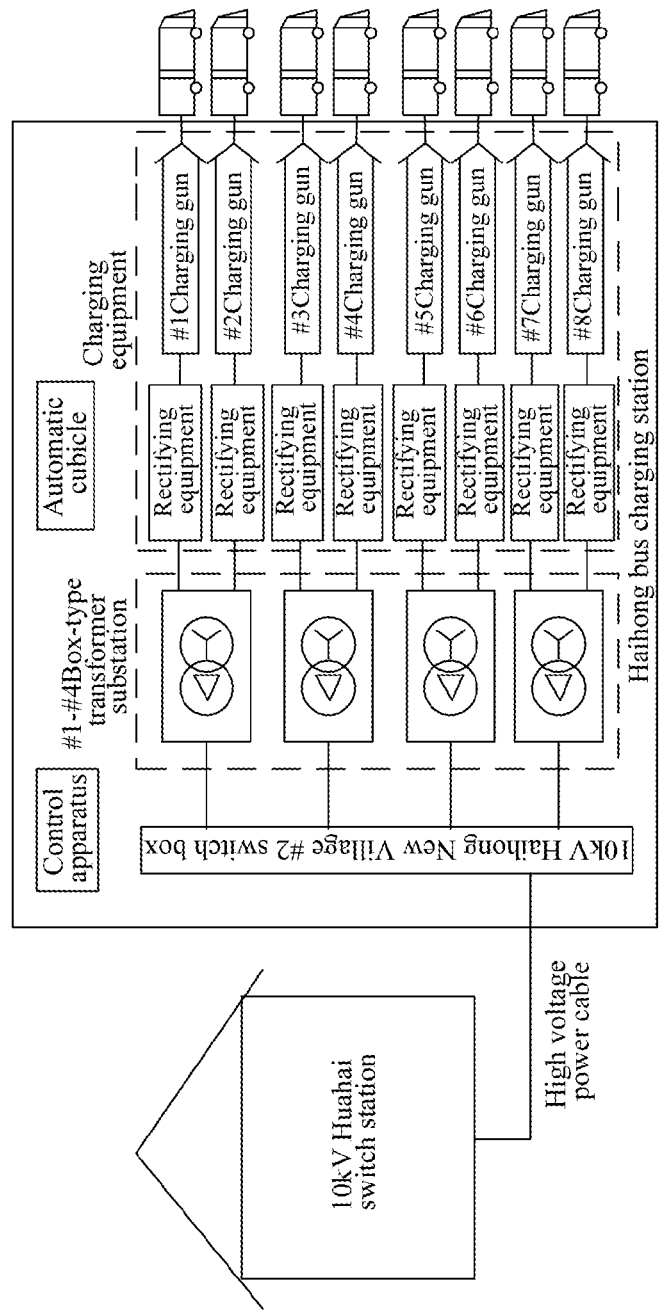
FIG. 1 is a schematic structural diagram of a charging system in the prior art.
Figure 2:
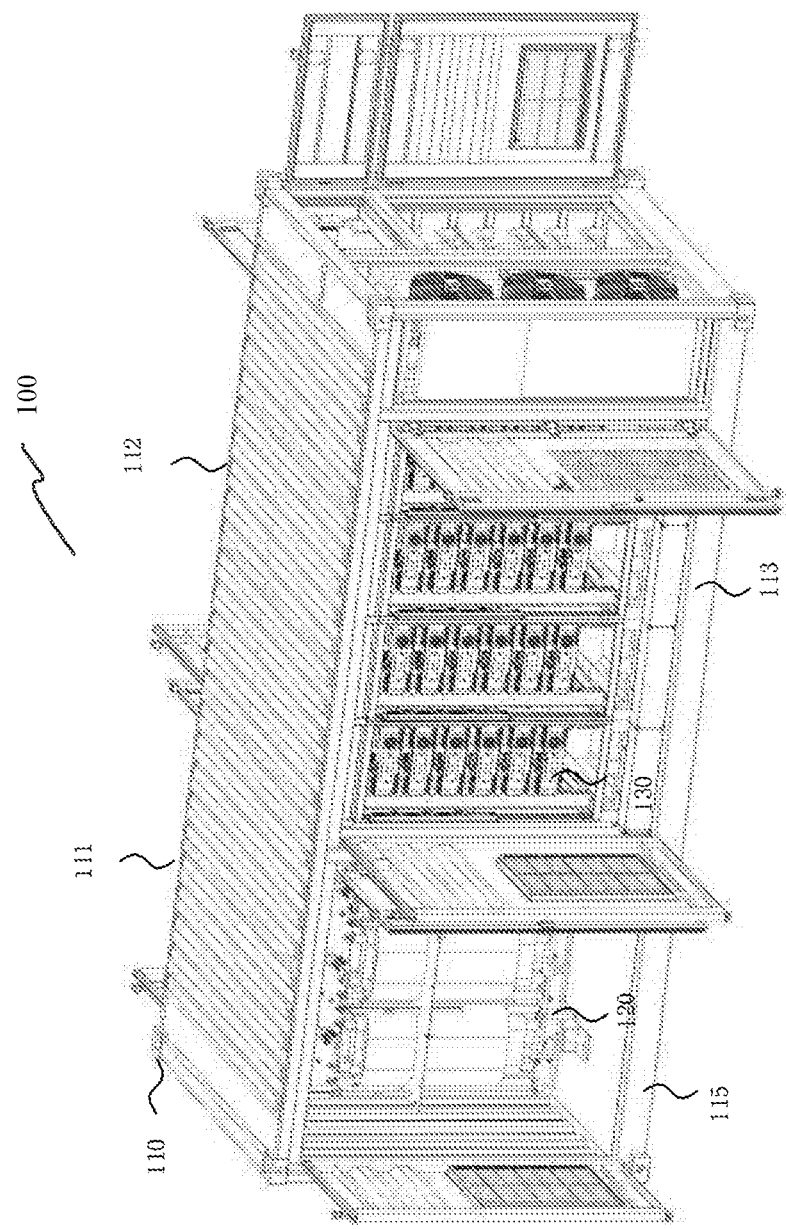
FIG. 2 is a schematic front structural diagram of a centralized charging cabinet according to an exemplary embodiment of the present disclosure.
Figure 3:
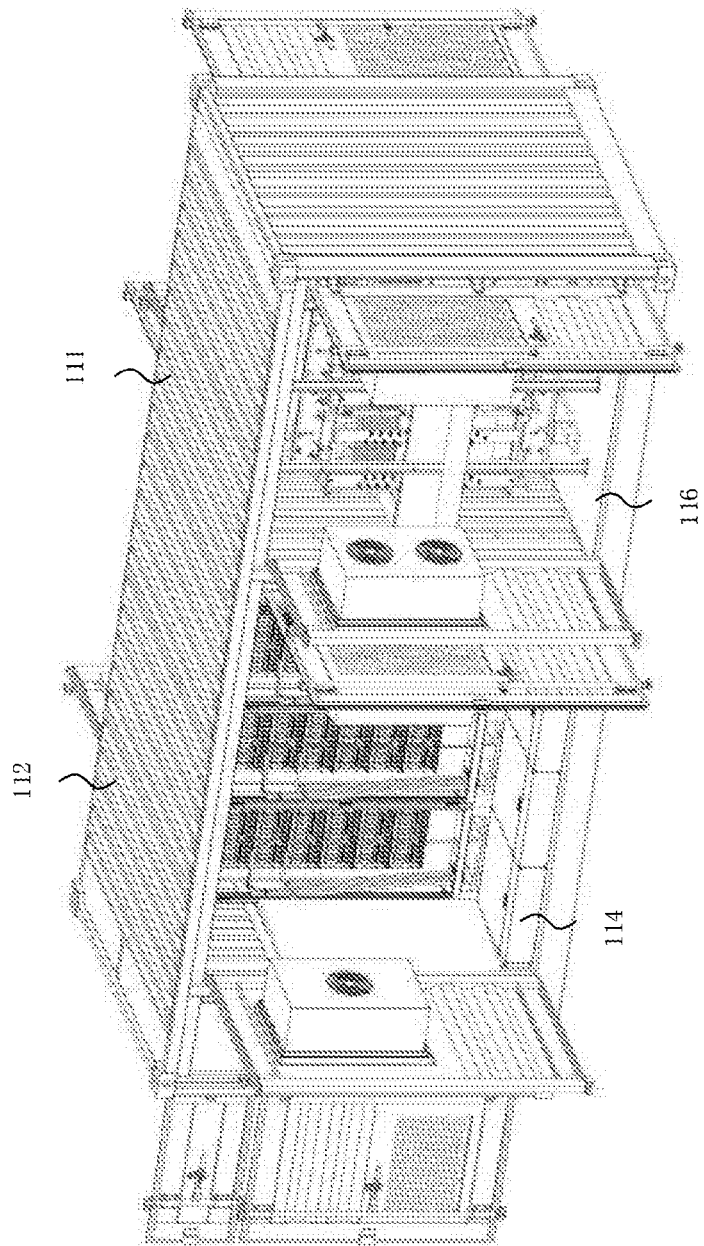
FIG. 3 is a schematic rear structural diagram of the centralized charging cabinet according to the embodiment of the present disclosure shown in FIG. 2.

FIG. 2 is a schematic front structural diagram of a centralized charging cabinet according to an exemplary embodiment of the present disclosure. FIG. 3 is a schematic rear structural diagram of the centralized charging cabinet according to the embodiment of the present disclosure shown in FIG. 2. As shown in FIG. 2 and FIG. 3, the centralized charging cabinet according to this embodiment includes a charging cabinet 110, an isolation transformer 120 and a charging unit 130. The number of the charging unit 130 may be one or more. The charging cabinet may be a standard container or a custom-made cabinet. The charging cabinet 110 is divided into two areas: one is an isolation area 111, the other is a charging area 112. An isolation transformer 120 is provided in the isolation area 111. The isolation transformer 120 may be a phase shifting transformer or a multi-winding transformer. The isolation transformer 120 may also include only one set of secondary windings. The structure of the isolation transformer 120 is not limited herein. A charging unit 130 is provided in the charging area 112. When the number of the charging unit 130 is multiple, the charging units 130 are arranged in an array in the charging area 112. For example, there are four columns in FIG. 2 with 6 charging units in each column, and it should be noted that the present disclosure is not limited thereto, and the number and arrangement of the charging units may be flexibly set according to actual needs.

In the above centralized charging cabinet, the charging area 112 is divided into a front region 113 and a back region 114, and each charging unit 130 is electrically connected to the secondary winding of the isolation transformer 120 through a plurality of first connection structures. The plurality of first connection structures are located at the back region 114 of the charging area 112. The isolation area 111 is divided into a front region 115 and a back region 116.

In this embodiment, a primary winding of the isolation transformer 120 is connected to a power distribution network, one set of secondary windings of the isolation transformer 120 are connected to an AC side of the charging unit 130 through the plurality of first connection structures, and a DC side of the charging unit 130 is connected to an external charging equipment, to realize charging of one external charging equipment by one charging unit 130.

In the centralized charging cabinet according to this embodiment, the isolation transformer is provided in the isolation area of the charging cabinet, the charging unit is provided in the charging area of the charging cabinet, and the connection between the charging unit and the isolation transformer is realized by using the plurality of first connection structures, which realizes integration of the charging unit and the isolation transformer in one cabinet and improves the space utilization. Further, the charging units are concentrate in the charging cabinet, then a casing of the charging unit can be designed according to an indoor application, and each charging unit does not need to be designed according to an outdoor application, which reduces a dustproof and waterproof standards for the casing of the charging unit, thereby not only reducing difficulty of the design of the mechanism, but also reducing a grade of material of the casing, then saving costs. In addition, the charging area is divided into the front region and the back region, the first connection structure is located at the back region of the charging area, so that a power line connecting the secondary winding of the isolation transformer and the charging unit is located at the back region that is not easily accessible, thereby achieving high-voltage area isolation and improving safety of the centralized charging cabinet.

In a centralized charging cabinet 200 according to another exemplified embodiment of the present disclosure, in addition to the charging cabinet, an isolation transformer 220 and a charging unit 230, a power distribution unit 240 is also included. The power distribution unit 240 is provided in the charging area. Each charging unit 230 is electrically connected to the power distribution unit 240 through a plurality of second connection structures, the plurality of second connection structures are located at the back region of the charging area, and the power distribution unit 240 is configured to be electrically connected to the external charging equipment.

Figure 4:
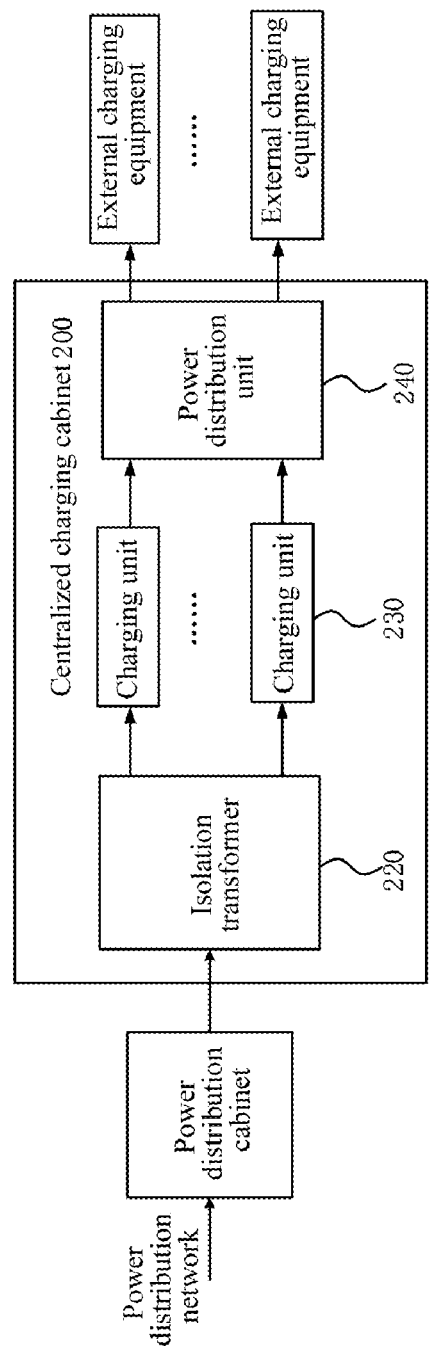
FIG. 4 is a circuit schematic diagram of a centralized charging cabinet according to another exemplary embodiment of the present disclosure.

FIG. 4 is a circuit schematic diagram of a centralized charging cabinet according to another exemplary embodiment of the present disclosure. As shown in FIG. 4, in this embodiment, a primary winding of an isolation transformer 220 is connected to an external power distribution cabinet, one set of secondary windings of the isolation transformer 220 is connected to an AC side of one charging unit 230 through a plurality of first connection structures, a DC side of each charging unit 230 is connected to a power distribution unit 240 through a plurality of second connection structures, and an external charging equipment is connected to the power distribution unit 240, to achieve charging of one external charging equipment by one charging unit 230. For example, an output of the power distribution unit 240 is connected to a charging gun. A charging equipment is charged using the charging gun. A communication interface of the charging unit 230 is directly connected to a communication interface of the charging gun. The second connection structure is located at the back region of the charging area, so that a power line connecting the charging unit 230 and the power distribution unit 240 is located at the back region, thereby achieving high-voltage area isolation and improving safety performance of the centralized charging cabinet.

The multiple outputs of the power distribution unit may be flexibly configured and combined, and one output may be connected to one charging equipment, two outputs may be combined together to charge one charging equipment, that is, two charging units may charge one charging equipment, and three outputs may be combined together, and so on. Any combination manner can be met.

When the above centralized charging cabinet is working, output power of a power distribution network is outputted to the charging gun or a dispenser of the user through the isolation transformer, the charging unit and the power distribution unit, to realize charging for the charging equipment.

Figure 5:
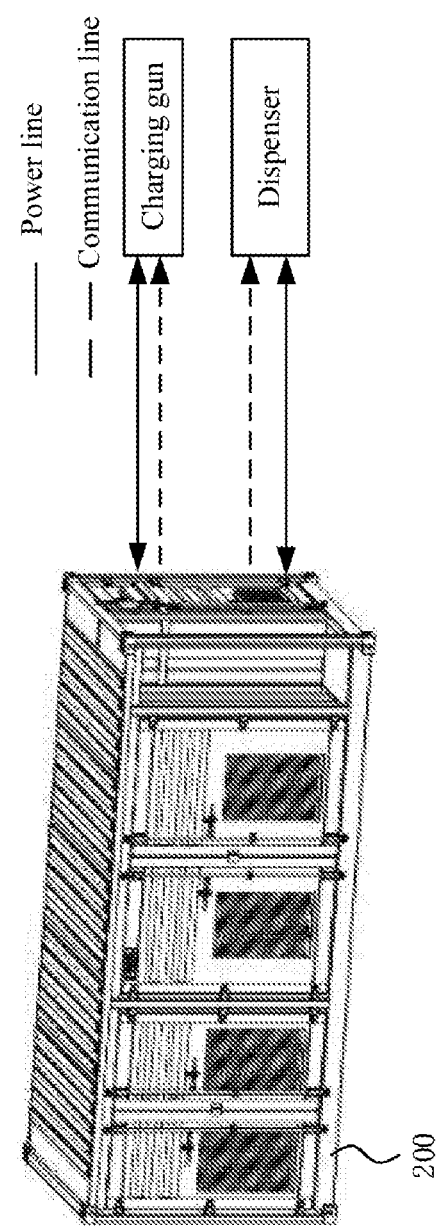
FIG. 5 is an output manner diagram of the centralized charging cabinet according to the embodiment of the present disclosure shown in FIG. 4.

FIG. 5 is an output manner diagram of the centralized charging cabinet according to the embodiment of the present disclosure shown in FIG. 4. As shown in FIG. 5, an output of the centralized charging cabinet 200 may be connected to the charging gun or the dispenser, and the charging output manner is diverse. There are three main charging protocols currently used, the Chademo protocol of Japan, the Combined Charging System (CCS) standard of Europe and the United States, and the national standard (GB) in China. An output communication line of the centralized charging cabinet 200 may be connected to the charging gun or the dispenser using any one of the above charging protocols, of which the universality is very strong.

Figure 6:
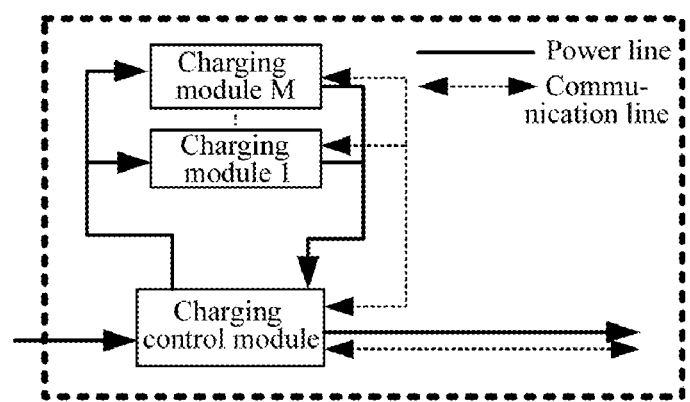
FIG. 6 is a circuit schematic diagram of a charging unit in a centralized charging cabinet according to the present disclosure.

FIG. 6 is a circuit schematic diagram of a charging unit in a centralized charging cabinet according to the present disclosure. As shown in FIG. 6, the charging unit 230 includes a charging control module and M charging module, where M is a positive integer greater than or equal to one. The M charging modules are connected in parallel. The M charging module is connected to the charging control module, and there are a power connection and a communication connection between the charging control module and the M charging module. There is a switch inside the charging control module. The M charging module is controlled by the switch to connect to the secondary winding of the isolation transformer or to disconnect with the secondary winding of the isolation transformer, and the output of the M charging module is controlled by the switch to connect to the power distribution unit or to disconnect with the power distribution unit. The charging control module issues a charging command to the M charging module through a communication line. An input of the charging control module is connected to the secondary winding of the isolation transformer, and an output of the charging control module is connected to the power distribution unit.

Figure 7:
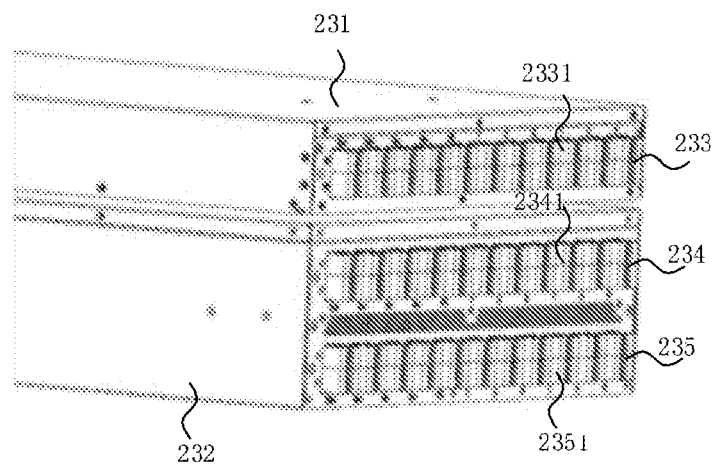
FIG. 7 is a schematic structural diagram of a charging unit in a centralized charging cabinet according to the present disclosure.

FIG. 7 is a schematic structural diagram of a charging unit in a centralized charging cabinet according to the present disclosure. As shown in FIG. 7, the charging unit 230 includes one charging control module 232 and M charging module 231. M is a positive integer greater than or equal to one. Only the case where M is 1 is given in FIG. 7, and when M is a positive integer greater than 1, the structure of each charging module 231 is the same. A first row of quick-connect terminals 233 is provided at a rear end of each of the charging modules 231, and a second row of quick-connect terminals 234 and a third row of quick-connect terminals 235 are provided at a rear end of the charging control module 232.

Figure 8:
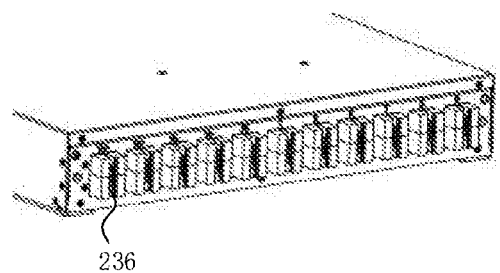
FIG. 8 is a schematic structural diagram of a quick-connect terminal of the charging unit shown in FIG. 7 according to the present disclosure.

FIG. 8 is a schematic structural diagram of a quick-connect terminal of the charging unit shown in FIG. 7 according to the present disclosure. As shown in FIG. 8, the number of quick-connect terminals 236 in each row of quick-connect terminals is 11, where the first quick-connect terminal to the fourth quick-connect terminal are DC quick-connect terminals and are DC output ends of the charging control module or the charging module, the fifth quick-connect terminal is a ground terminal, and the sixth quick-connect terminal to the eleventh quick-connect terminal are AC quick-connect terminals and are AC input ends of the charging control module or the charging module. It should be noted that the number of the quick-connect terminals in each row of the quick-connect terminals in the charging unit is not limited thereto and may be flexibly set according to actual needs.

In the above centralized charging cabinet, the first row of quick-connect terminals 233 and the second row of quick-connect terminals 234 are connected in one-to-one correspondence, and corresponding quick-connect terminals are connected through a connecting busbar, where the first row of quick-connect terminals 233, the second row of quick-connect terminals 234, the third row of quick-connect terminals 235 and the connecting busbar are all located at the back region of the charging area.

Figure 9:
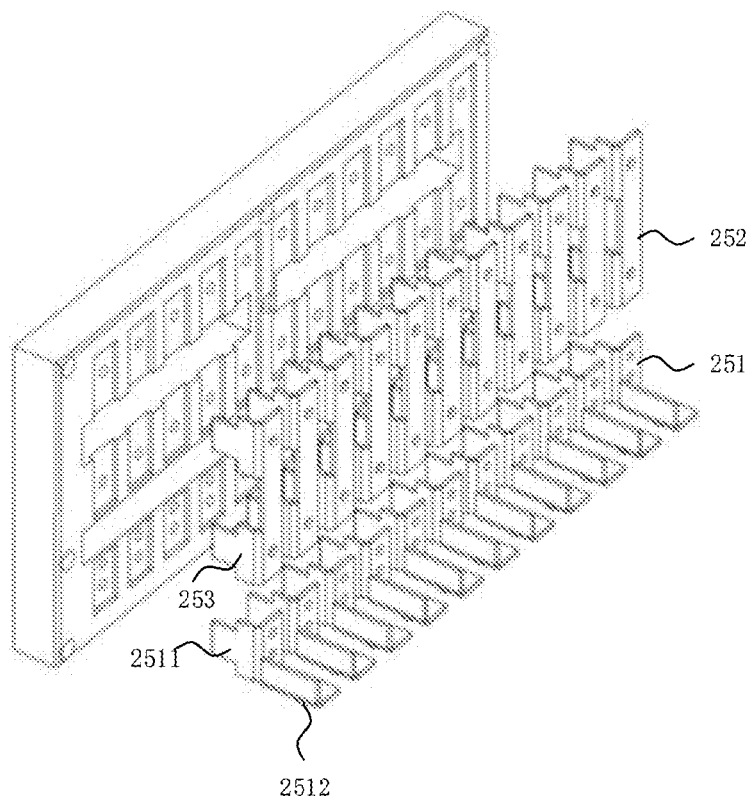
FIG. 9 is a schematic connection diagram of a charging unit in a centralized charging cabinet according to the present disclosure.

FIG. 9 is a schematic connection diagram of a charging unit in a centralized charging cabinet according to the present disclosure. As shown in FIG. 9, electrical connection between the quick-connect terminals is realized through a connecting busbar 252, and electrical connection between the quick-connect terminals, the secondary winding of the transformer and the power distribution unit is realized through a wiring busbar 251. The first connection structure and the second connection structure are the wiring busbar 251. The first connection structure is used to realize the connection between the secondary winding of the isolation transformer and the charging unit, and the second connection structure is used to realize the connection between the charging unit and the power distribution unit.

Referring FIG. 7 to FIG. 9, a quick-connect terminal 2331 of the charging module is electrically connected to a quick-connect terminal 2341 in the charging control module through the connecting busbar 252, and the number of the connecting busbars corresponds to the number of the quick-connect terminals in each row, thereby realizing one-to-one correspondence connection between the first row of quick-connect terminals and the second row of quick-connect terminals. The quick-connect terminal 2341 in the charging control module belongs to the second row of quick-connect terminals. For example, the number of quick-connect terminals in each row is eleven, then eleven connecting busbars are provided correspondingly. As shown in FIG. 9, a plurality of protrusions 253 is provided on each connecting busbar, and the number of the protrusions is the same as the total number of the charging control module and the charging module. For example, if the charging unit includes one charging module, then two protrusions 253 are provided on each connecting busbar 252, and if the charging unit includes two charging modules, then three protrusions 253 are provided on each connecting busbar 252. The charging unit includes the charging control module and one charging module, two protrusions are provided on the connecting busbar, where one protrusion of the connecting busbar is plugged into one quick-connect terminal 2331 of the charging module, and the other protrusion of the connecting busbar is plugged into one quick-connect terminal 234 of the charging control module. The quick-connect terminal 2341 belongs to the second row of quick-connect terminals. Referring to FIG. 9, positions of the above two quick-connect terminals 2331 and 2341 correspond to each other, that is, located in a same column, to realize electrical connection between corresponding power terminals in the charging control module and the charging module, for example, electrical connection between corresponding AC input ends of the charging module and the charging control module, or electrical connection between corresponding DC input ends of the charging module and the charging control module, or electrical connection between ground terminals of the charging module and the charging control module. If the charging unit includes three charging modules, then the number of the protrusions in the connecting busbar 252 is four, where a lowermost protrusion is connected to the quick-connect terminal of the charging control module, and the rest three protrusions are correspondingly connected to the quick-connect terminals of the three charging modules, respectively, to realize parallel connection between the three charging modules and the connection between the charging module and the charging control module.

The charging control module 232 is connected to the charging module 231 through the connecting busbar 252, which reduces use of wire material, saves the space and reduces installation difficulty. A user can stand in the front region of the charging area and directly plug the charging control module and charging module into the connecting busbar or pull out the charging control module and the charging module from the connecting busbar. The charging control module or the charging module can be easily installed and maintained.

Referring to FIG. 7 to FIG. 9, the quick-connect terminal 2351 of the charging control module is electrically connected to one end 2511 of the wiring busbar 251, and the number of the wiring busbar corresponds to the number of the quick-connect terminals in each row, thereby realizing one-to-one correspondence connection between the third row of quick-connect terminals and the wiring busbars. The quick-connect terminal 2351 belongs to the third row of quick-connect terminals. For example, the number of the third row of quick-connect terminals is eleven, then eleven connecting busbars are provided correspondingly. In the third row of quick-connect terminals, a quick-connect terminal connected to the AC input end of the charging control module is the AC quick-connect terminal, a quick-connect terminal connected to the ground terminal of the charging control module is the ground terminal, a quick-connect terminal connected to the DC output end of the charging control module is the DC quick-connect terminal, a wiring busbar connected to the AC quick-connect terminal is the first connection structure, and a wiring busbar connected to the DC quick-connect terminal is the second connection structure. For example, the number of the quick-connect terminals in each row in FIG. 7 is eleven, then the total number of the wiring busbars is eleven. From left to right, the first wiring busbar to the fourth wiring busbar are all the second connection structures, and the sixth wiring busbar to the eleventh wiring busbar are all the first connection structures.

As shown in FIG. 9, one end of the wiring busbar 251 is provided with the protrusion 2511, the other end of the wiring busbar is provided with a threaded hole 2512, and the protrusion 2511 is plugged into one quick-connect terminal 2351 of the charging control module, where the quick-connect terminal 2351 belongs to the third row of quick-connect terminals. The threaded hole 2512 is used to install a cable from a tap of the secondary winding of the isolation transformer or a cable connected to the power distribution unit.

Threaded holes of the plurality of second connection structures are connected to the cable of the power distribution unit, and protrusions of the plurality of second connection structures are plugged into the DC quick-connect terminals of the charging control module in one-to-one correspondence, where the DC quick-connect terminals belong to the third row of quick-connect terminals, thereby realizing one-to-one correspondence connection between a plurality of the DC output ends of the charging control module and an end of the plurality of second connection structures, and the second connection structure is electrically connected to the power distribution unit through the second connection line, so that electrical connection between the charging unit and the power distribution unit can be realized.

Threaded holes of the plurality of first connection structures are connected to the cable from the tap of the secondary winding of the isolation transformer, protrusions of the plurality of first connection structures are plugged into the AC quick-connect terminals of the charging control module in one-to-one correspondence, where the AC quick-connect terminals belong to the third row of quick-connect terminals, thereby realizing one-to-one correspondence connection between a plurality of the AC input ends of the charging control module are connected to an end of the plurality of first connection structures in one-to-one correspondence, and the first connection structure is electrically connected to the isolation transformer through the first connection line, so that electrical connection between the charging unit and the secondary winding of the isolation transformer can be realized. The wiring busbar connected to the ground terminal in the third row of quick-connect terminals is connected to the casing or the ground.

In another embodiment of the present disclosure, a circuit breaker may also be connected in series in the first connection line, and the first connection structure is electrically connected to the isolation transformer through the cable and the circuit breaker. The circuit breaker is provided between the first connection structure and the isolation transformer, that is, the circuit breaker is provided between the charging unit and the isolation transformer, which may realize the following functions: when the charging unit is faulty and needs maintenance, disconnecting the circuit breaker corresponding to the faulty charging unit, to ensure no-electric operation and improves safety protection; when a load is abnormal and overcurrent occurs, the circuit breaker is disconnected for overcurrent protection; and when a short circuit occurs inside the charging unit, the circuit breaker is disconnected for short circuit protection.

Two rows of the quick-connect terminals in the charging control module are respectively connected to the connecting busbars and the wiring busbars, which reduces the use of wire material, saves the space and reduces installation difficulty. The user can stand in the front region of the charging area and plug the charging control module into the connecting busbar and the wiring busbar or pull out the charging control module from the connecting busbar and the wiring busbar. The charging control module can be easily installed and maintained.

Figure 10:
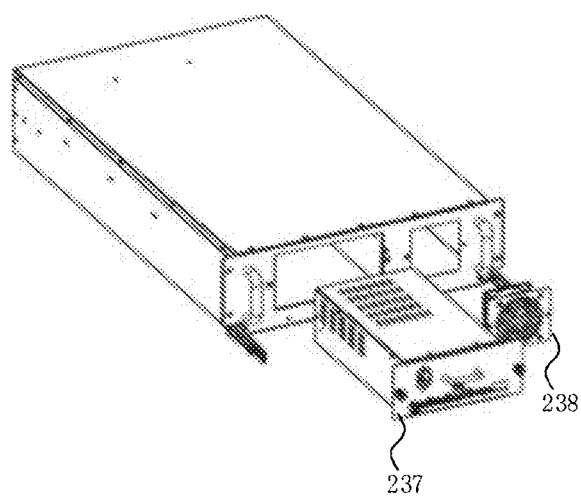
FIG. 10 is a schematic structural diagram of a charging control module in a centralized charging cabinet according to the present disclosure.

FIG. 10 is a schematic structural diagram of a charging control module in a centralized charging cabinet according to the present disclosure. As shown in FIG. 10, a heat dissipation fan 238 and a control module 237 are provided in the charging control module. The control module 237 is pluggable, and is fixed to a panel by a screw, and the control module may be taken out by screwing off the screw for locking the control module 237 on a front panel. The heat dissipation fan 238 would be damaged due to influence of dust, application environment and service life. Since the heat dissipation fan 238 is fixed to the front panel by a screw, when the heat dissipation fan 238 is damaged, the heat dissipation fan 238 may be taken out for easy replacement by screwing off the screw for locking the control module 237 on a front panel.

In the centralized charging cabinet, the primary winding of the isolation transformer is provided at the front region of the isolation area. The secondary winding of the isolation transformer is provided at the back region of the isolation area. The first connection line connected to the secondary winding of the isolation transformer enters the charging area from the isolation area along a top side of the charging cabinet, to realize electrical connection between the first connection line and the first connection structure. The second connection line connected to the charging unit is connected to the power distribution unit along a bottom side of the charging cabinet, to realize electrical connection between the second connection line and the power distribution unit. The connecting busbar, the wiring busbar, the first connection line and the second connection line, which are connection structures for transmitting high voltage and high current, are all located at the back region of the charging area, achieving isolation of strong electricity and improving the safety of the centralized charging cabinet. The input and output of the charging area are both located at the back region. Inputting from the top side of the charging cabinet, outputting from the bottom side of the charging cabinet and cabling on a same side save the space and reduce distribution lines.

In the centralized charging cabinet according to this embodiment, a structure in which M charging modules and one charging control module are provided can increase a charging power of each charging unit. The charging control module is connected to the charging module through the connecting busbar, and the charging control module is connected to the wiring busbar, which reduces of use of wire material, saves space and reduces installation difficulty. The user can directly plug the charging control module and the charging module into the busbar or pull out the charging control module and the charging module from the busbar in the front region of the charging area, to realize the installation and maintenance of the charging control module or the charging module. The installation and maintenance are easy and the safety performance is high. In addition, the input and output of the charging area are both located at the back region of the charging area. The back region of the charging area is a higher voltage area. It is only required to be entered during special maintenance is performed, and power-off operation is required. There is only communication interface at the front region of the charging area, on which is a safe voltage below 24V, thereby not only achieving a separation of strong and weak electricity, but also general maintenance operation of the charging unit can be performed under the condition without power-off.

Figure 11:
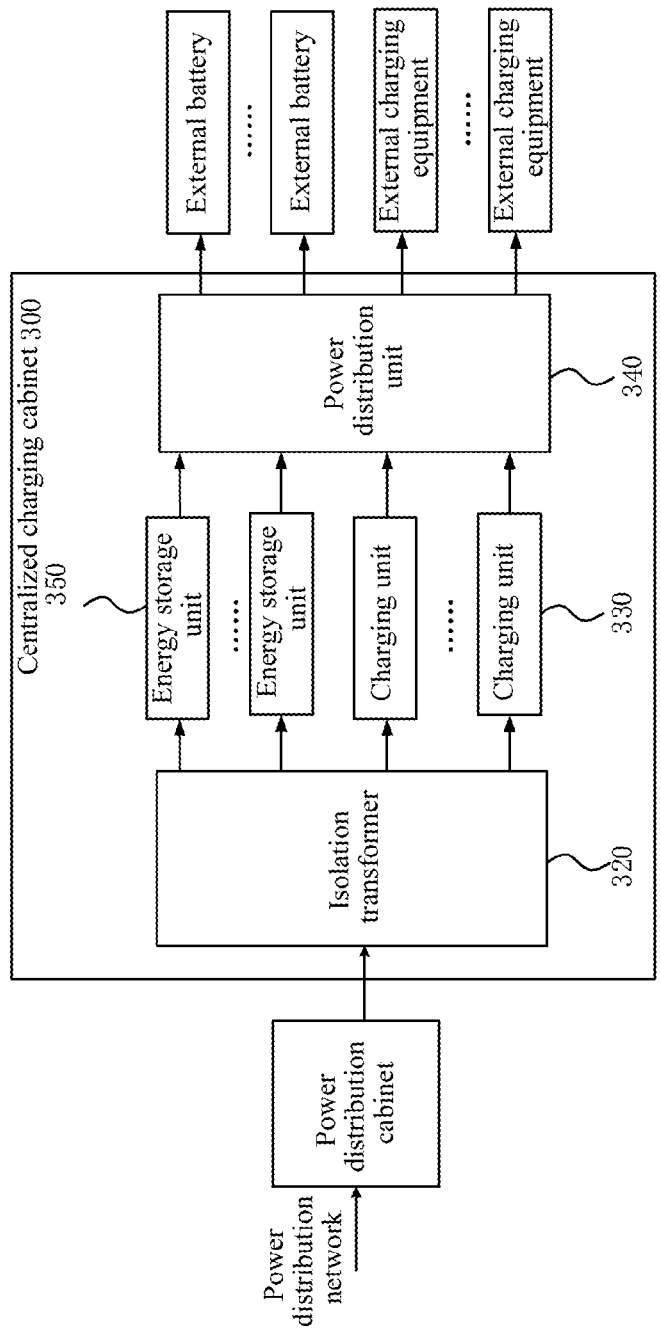
FIG. 11 is a circuit schematic diagram of a centralized charging cabinet according to yet another exemplary embodiment of the present disclosure.

FIG. 11 is a circuit schematic diagram of a centralized charging cabinet according to yet another exemplary embodiment of the present disclosure. As shown in FIG. 11, in the centralized charging cabinet 300 provided in this embodiment, an energy storage unit 350 is further included, in addition to the charging cabinet, the isolation transformer 320, the charging unit 330 and the power distribution unit 340. The number of the energy storage unit 350 is one or more, and the energy storage unit 350 is provided in the charging area. Each of the energy storage unit 350 is electrically connected to the secondary winding of the isolation transformer 320 through a plurality of third connection structures, each of the energy storage unit 350 is further electrically connected to the power distribution unit 340 through a plurality of fourth connection structures, and the energy storage unit 350 is electrically connected to an external battery through the power distribution unit 340. The plurality of third connection structures and the plurality of fourth connection structures are respectively located at the back region of the charging area.

Figure 12:
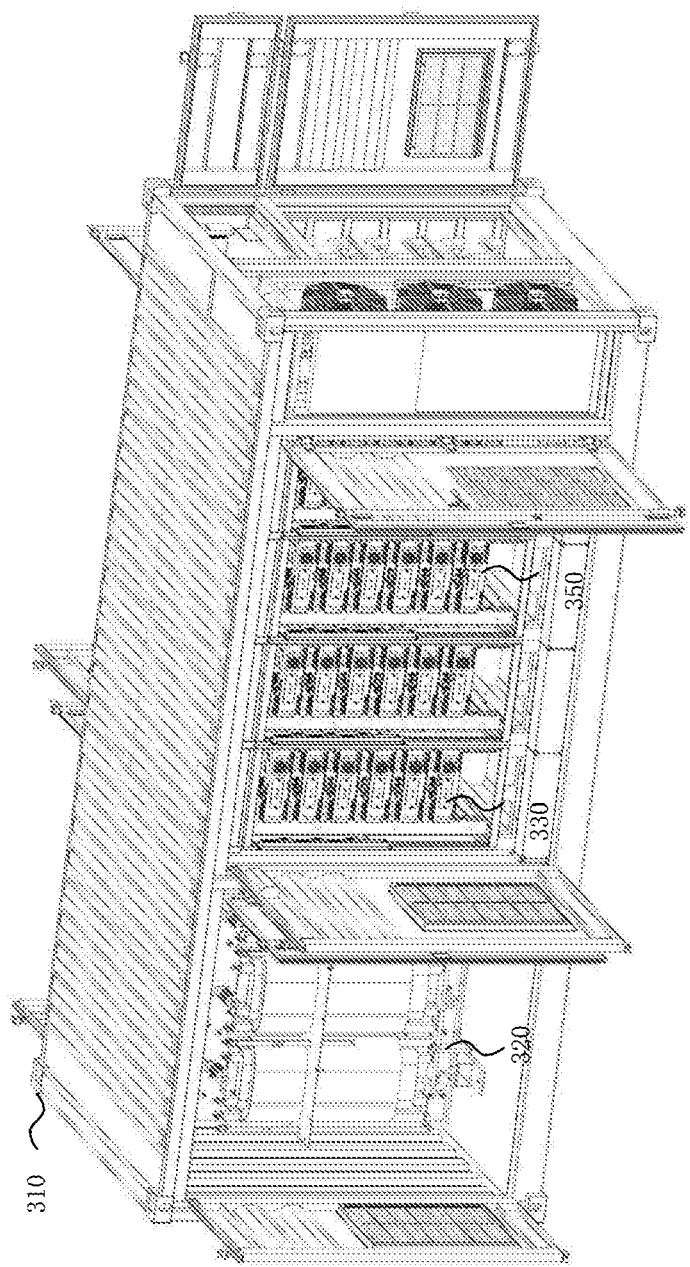
FIG. 12 is a schematic structural diagram of the centralized charging cabinet according to the embodiment according to the present disclosure shown in FIG. 11.

FIG. 12 is a schematic structural diagram of the centralized charging cabinet according to the embodiment according to the present disclosure shown in FIG. 11. As shown in FIG. 12, in this embodiment, a primary winding of the isolation transformer 320 is connected to a power distribution network, one set of secondary windings of the isolation transformer 320 are connected to an AC side of one charging unit 330 through a plurality of first connection structures, a DC side of each charging unit 330 is connected to a power distribution unit 340 through a plurality of second connection structures, and an external charging equipment is connected to the power distribution unit 340, to realize charging for one external charging equipment by one charging unit 330. One set of the secondary windings of the isolation transformer 320 is connected to an AC side of one energy storage unit 350 through a plurality of third connection structures, a DC side of each energy storage unit 350 is connected to the power distribution unit 340 through a plurality of fourth connection structures, and an external battery is connected to the power distribution unit 340, to realize capacity expansion of the power distribution network by the external battery through the energy storage unit 350.

The energy storage unit is similar in structure to the charging unit. The energy storage unit includes one energy storage control module and L energy storage module. The number of energy storage modules is one or more, and the energy storage control module is electrically connected to each of the L energy storage module. L is a positive integer greater than or equal to one. The AC side of the energy storage control module is connected to the isolation transformer 320, and the DC side of the energy storage control module is connected to the external battery through the power distribution unit.

Still referring to FIG. 12, in the above centralized charging cabinet 300, when a capacity of the external battery exceeds a first preset threshold, one energy storage unit having a capacity exceeding a second preset threshold is provided in the charging area, the centralized charging cabinet 300 includes only one energy storage unit 350, and the energy storage unit 350 is correspondingly connected to the battery through the power distribution unit 340. A structure of the energy storage unit 350 may be selected to be one energy storage control module and a plurality of the energy storage modules, such that a single energy storage unit can output a greater power, to meet charge and discharge power requirements of a single large capacity battery.

When the capacity of the external battery is smaller than a preset third threshold, a plurality of energy storage units having a capacity smaller than a preset fourth threshold are provided in the charging area, the centralized charging cabinet 300 includes a plurality of energy storage units 350, and the plurality of energy storage units 350 are electrically connected to a plurality of batteries in one-to-one correspondence. The charging and discharging power of a single small-capacity battery is low, and the energy storage unit 350 may be selected to have a structure of one energy storage control module and one energy storage module. Such an energy storage unit has low charging and discharging power which matches the charging and discharging power of the single small-capacity battery. The first threshold much greater than the third threshold, and the second threshold is greater than the fourth threshold, that is, a battery having a capacity exceeding the first threshold is a large-capacity battery, but the battery is expensive, and a battery having a capacity smaller than the third threshold is a small-capacity battery, and the battery is relatively cheap.

Compared with the embodiment shown in FIG. 2, in FIG. 12, the L charging unit is replaced with the L energy storage unit, the L energy storage unit and the L batteries are connected in one-to-one correspondence, and one energy storage unit controls the charging and discharging of one small-capacity battery, to form a centralized charging and storage system. In use, for safety rules considerations, the multiple batteries need to be electrically isolated from each other. In the charging cabinet, the L energy storage units are connected to L sets of the secondary windings of the isolation transformer, and electrical isolation is achieved therebetween. Therefore, after the L energy storage units are connected to the L batteries, the L batteries are also electrically isolated from each other.

The connection manner of the energy storage unit with the power distribution unit and the isolation transformer is the same as that of the charging unit with the power distribution unit and the isolation transformer. A fourth row of quick-connect terminals is provided at a rear end of each of the energy storage modules; a fifth row of quick-connect terminals and a sixth row of quick-connect terminals are provided at the rear end of the energy storage control module; where the fourth row of quick-connect terminals and the fifth row of quick-connect terminals are connected in one-to-one correspondence, and corresponding quick-connect terminals are connected through a connecting busbar, to realize electrical connection between the energy storage control module and the energy storage module, and parallel electrical connection between the L energy storage modules, to realize convenient installation and maintenance of the energy storage unit. The fourth row of quick-connect terminals, the fifth row of quick-connect terminals, the sixth row of quick-connect terminals and the connecting busbar are all located at the back region of the charging area. The structure for transmitting high-voltage and high-current is located at the back region that is not easily accessible, thereby achieving safety isolation of the high-voltage area and improving the safety performance of the centralized charging cabinet.

The sixth row of quick-connect terminals includes a plurality of input terminals and a plurality of output terminals, and the plurality of input terminals are connected to an end of the plurality of third connection structures in one-to-one correspondence. The secondary winding of the isolation transformer is electrically connected to the other end of the third connection structure through a third connection line, and the third connection line enters the charging area from the isolation area along a top side of the charging cabinet. The plurality of output terminals are connected to an end of the plurality of fourth connection structures in one-to-one correspondence. The fourth connection structure is connected to the power distribution unit through a fourth connection line, and the fourth connection line is connected to the power distribution unit along a bottom side of the charging cabinet.

In the centralized charging cabinet according to this embodiment, the connection manner of the energy storage unit with the isolation transformer and the power distribution unit is the same of that of charging unit with the isolation transformer and the power distribution unit, so that the charging unit can be quickly replaced with the energy storage unit. The connection relationship between the energy storage control module and the energy storage module in the energy storage unit is the same as that between the charging control module and the charging module, which will not be repeated herein. Some charging units in the charging cabinet are replaced with the energy storage units, and the external battery is provided at the same time, so that an integrated charging and storage system can be realized, which realizes that the external battery supplies electric power when the capacity of the power distribution network is not sufficient.

Figure 13:
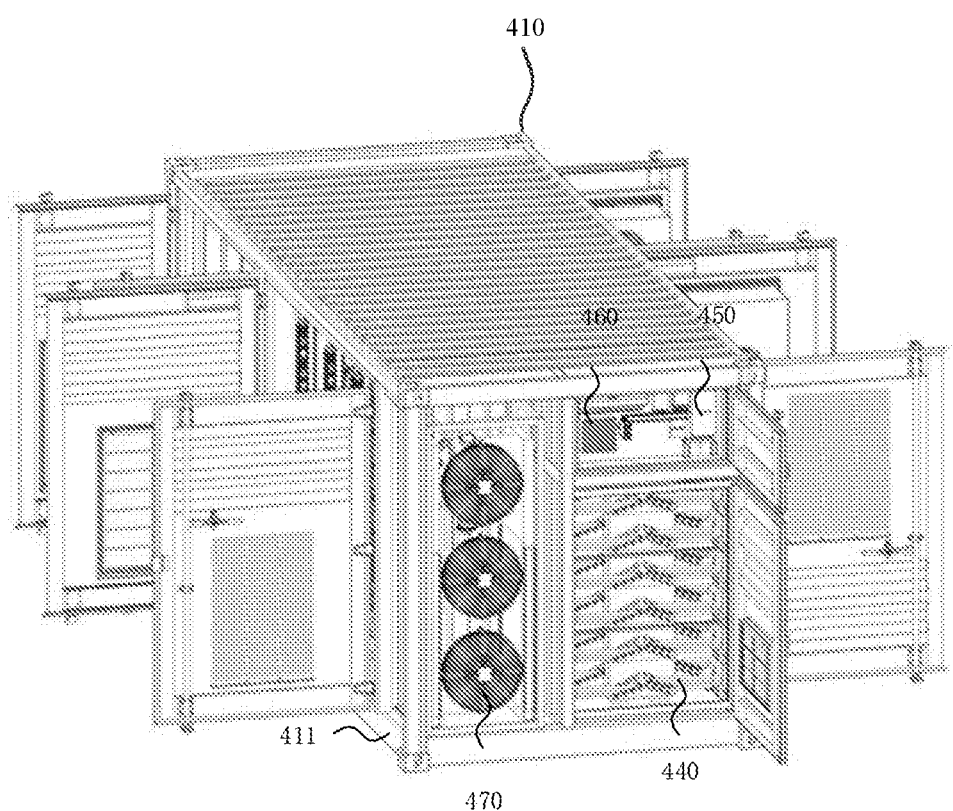
FIG. 13 is a schematic side diagram of a centralized charging cabinet according to yet another exemplary embodiment of the present disclosure.

FIG. 13 is a schematic side view of a centralized charging cabinet according to yet another exemplary embodiment of the present disclosure. As shown in FIG. 13, in the centralized charging cabinet 400 provided by this embodiment, in addition to the charging cabinet 410, the isolation transformer 420, the charging unit 430 and the power distribution unit 440, an auxiliary power supply 450, a monitoring unit 460 and a heat dissipation system 470 are further included. An auxiliary area 411 is provided in the charging area, and both the auxiliary power supply 450 and the monitoring unit 460 are provided in the auxiliary area 411. The monitoring unit 460 includes a monitor and a communication module. According to actual needs, if many vehicles are required to be charged at the same time, a large centralized charging cabinet including the communication module, the auxiliary power supply 450 and the monitor may be selected.

Figure 14:
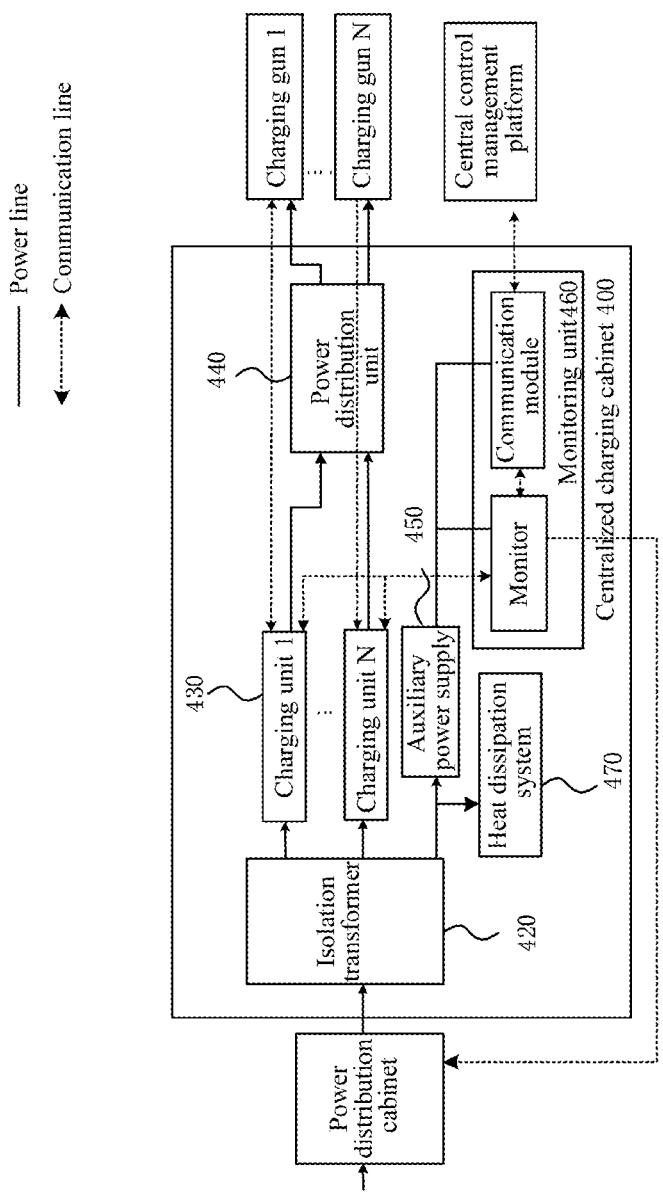
FIG. 14 is a circuit schematic diagram of the centralized charging cabinet according to the embodiment of the present disclosure shown in FIG. 13.

FIG. 14 is a circuit schematic diagram of the centralized charging cabinet according to the embodiment of the present disclosure shown in FIG. 13. As shown in FIG. 14, the primary winding of the isolation transformer 420 is connected to the power distribution cabinet outside the charging cabinet, the secondary winding of the isolation transformer 420 is connected to N charging units 430, where N is a positive integer greater than or equal to one. Power output of the N charging unit 430 is connected to the power distribution unit 440, output of the power distribution unit 440 is connected to the charging gun or the dispenser, and the communication interface of the charging unit 430 is directly connected to the communication interface of the charging gun or the dispenser. The auxiliary power supply 450 is electrically connected to the secondary winding of the isolation transformer 420, the monitor and the communication module, respectively. The communication module communicates with an external central control management platform. The monitor communicates with the charging unit 430 and the communication module, respectively.

During the operation of the above large centralized charging cabinet, the monitor communicates with each charging unit to obtain charging voltage, current and operating state information of each charging unit. The monitor simultaneously monitors temperature, humidity inside the entire charging cabinet and temperature of the isolation transformer, and outputs the above information to central control management platform through the communication module. The central control management platform can issue a maximum charging power command to the monitor through the communication module, and the monitor issues the command to the charging unit, to limit the maximum power that the charging unit can output. The monitor communicates with the power distribution cabinet. When a serious fault such as the temperature in the charging cabinet is too high or the temperature of the isolation transformer is too high occurs, the monitor notifies the power distribution cabinet to disconnect with the power network.

Figure 15:
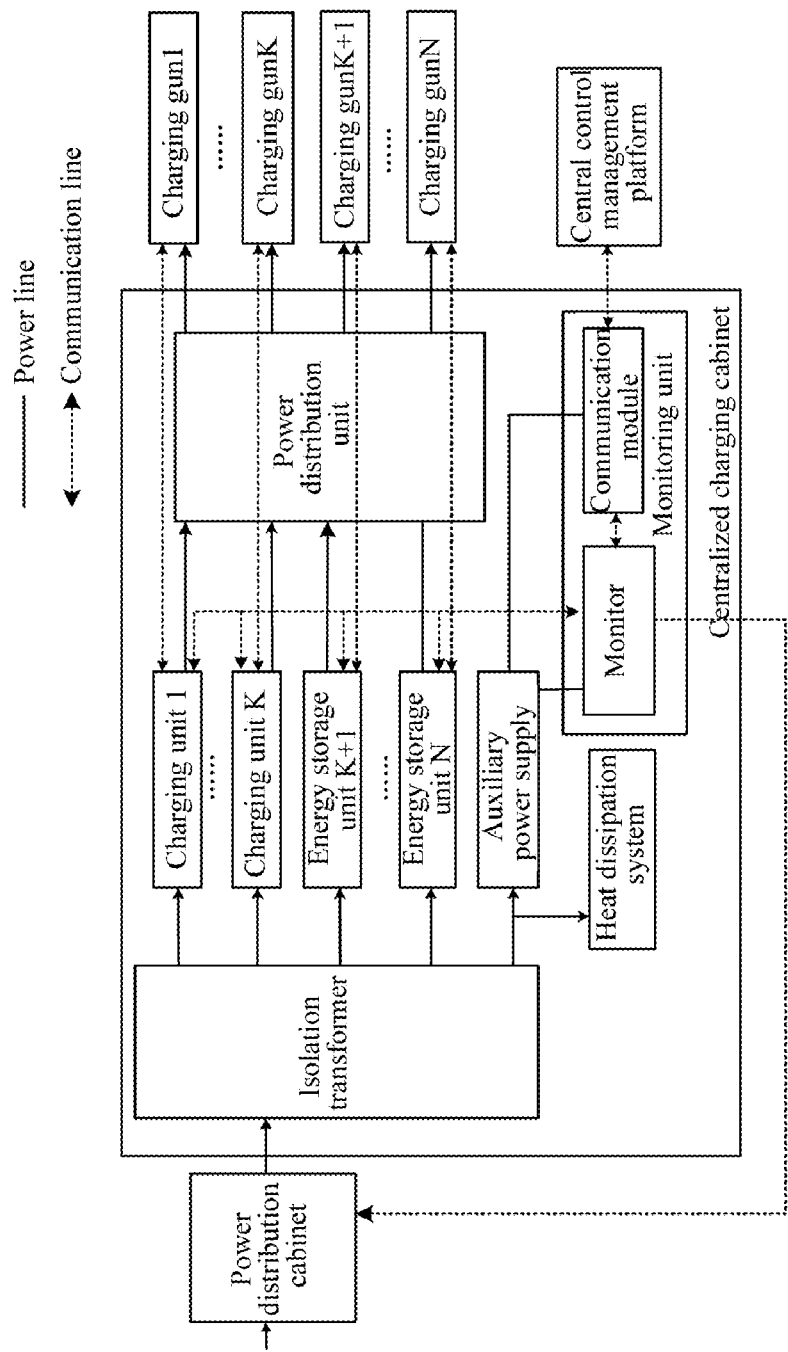
FIG. 15 is a circuit schematic diagram of a centralized charging cabinet according to still another exemplary embodiment of the present disclosure.

FIG. 15 is a circuit schematic diagram of a centralized charging cabinet according to still another exemplary embodiment of the present disclosure. Compared with FIG. 14, in this embodiment, a plurality of the charging unit is replaced with a plurality of energy storage units, to form a centralized intelligent charging cabinet. The detailed description may be referred to as FIG. 14, which will not be repeated herein.

Figure 16:
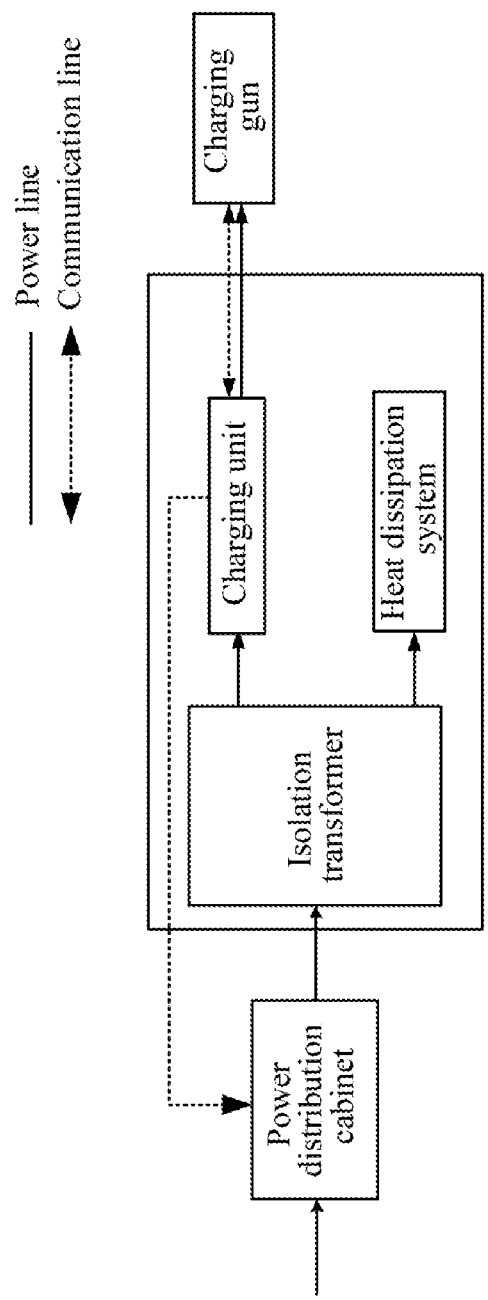
FIG. 16 is a circuit schematic diagram of a centralized charging cabinet according to still another exemplary embodiment of the present disclosure.

FIG. 16 is a circuit schematic diagram of a centralized charging cabinet according to still another exemplary embodiment of the present disclosure. If only one vehicle is required to be charged, the centralized charging cabinet may not include the communication module, the auxiliary power supply and the monitor. The centralized charging cabinet is a small centralized charging system. The primary winding of the isolation transformer is connected to the power distribution cabinet outside the charging cabinet, the secondary winding of the isolation transformer is connected to the charging unit, the output of the charging unit is connected to the power distribution unit, and the power distribution unit connects the power output of the charging unit to the charging gun or the dispenser of the user. Only one charging unit is included in the charging cabinet. The charging unit monitors the temperature and the humidity in the entire charging cabinet and the temperature of the isolation transformer. The charging unit communicates with the power distribution cabinet through a communication line located at the front region of the charging area. When a serious fault such as the temperature in the charging cabinet is too high or the temperature of the isolation transformer is too high occurs, the charging unit notifies the power distribution cabinet to disconnect with the power network. The charging unit includes one charging control module and a plurality of the charging modules that are connected in parallel. The plurality of the charging modules is connected in parallel can increase the charging power of the single vehicle.

In this embodiment, the isolation transformer may be a phase shifting transformer or a multi-winding transformer. The primary winding of the isolation transformer is connected to the power distribution network. The power distribution network may be a low voltage 380V power network or a medium voltage power network. When the isolation transformer is a phase shifting transformer, the phase shifting transformer has 2N+1 sets of secondary windings. One set of the secondary windings provide power for the auxiliary power supply and the heat dissipation system. The auxiliary power supply is configured to provide power for the monitor and the communication module. The auxiliary power supply is connected to an uninterruptible power system (UPS) at the same time. When the isolation transformer or the power distribution network fails, the UPS provides power for the monitor and the communication module. The rest 2N sets of the secondary windings are connected to the N charging units in the charging area, where each two sets of the secondary windings are connected to one charging unit. If the isolation transformer is a multi-winding transformer, then it has N+1 sets of the secondary windings. Similarly, one set of the secondary windings provide power for the auxiliary power supply and the heat dissipation system. The auxiliary power supply is configured to provide power for the monitor and the communication module. The auxiliary power supply is connected to a UPS at the same time. When the isolation transformer or the power network fails, the auxiliary power supply provides power for the monitor and the communication module. The rest N sets of the secondary windings are connected to the N charging units in the charging area, where each secondary winding is connected to one charging unit.

Since the secondary windings of the isolation transformer are electrically isolated with each other, and different charging units are connected to different secondary windings, which realizes electrical isolation between the N charging units. Electrical isolation may not need to be repeatedly performed on the charging unit, thereby achieving centralized isolation.

In this embodiment, a door of the isolation area of the charging cabinet and the power distribution cabinet have an interlocking mechanism. Only when the switch of the power distribution cabinet is disconnected, the door of the isolation area can be opened to ensure the safety of the operator. Referring to FIG. 15, when the isolation transformer is connected to the medium voltage power network, communication exists between the monitor and the power distribution cabinet. The monitor monitors a state of the door of the isolation area in real time. When the isolation area is abnormally opened, the monitor notifies the power distribution cabinet to disconnect with the power network through the communication with the power distribution cabinet. Referring to FIG. 16, when the isolation transformer is connected to the medium voltage network, communication exists between the charging unit and the power distribution cabinet. The charging unit monitors the state of the door of the isolation area. When the door of the isolation area is abnormally opened, the charging unit notifies the power distribution cabinet to disconnect the power network through the communication with the power distribution cabinet.

In this embodiment, the heat dissipation system includes a water cooler, a main water inlet pipe, a main water outlet pipe, a branch water inlet pipe and a branch water outlet pipe. The number of the branch water inlet pipe and the number of the branch water outlet pipe may both be one or more. Each of the main water inlet pipe, the main water outlet pipe, the branch water inlet pipe and the branch water outlet pipe are provided in the charging cabinet. The main water outlet pipe and the main water inlet pipe are located at the bottom side of the charging cabinet. After the main water outlet pipe and the main water inlet pipe enter the charging area, several sets of the branch water outlet pipes and several sets of the branch water inlet pipes are led from the bottom to the top. Each of the branch water outlet pipe and the branch water inlet pipe are pulled out one thin water pipe at a position horizontally with each charging module. Ends of the two thin water pipes are connected to male water connectors. Two heat dissipation ports are provided on each charging module, and female water connectors are provided on the heat dissipation ports. The male water connectors of the two thin water pipes are connected to female water connectors of the charging module, realizes that the charging module is connected to a water circulation system.

During the operation of the above heat dissipation system, the isolation transformer provides power for the water cooler. The water cooler makes coolant to flow from the water inlet pipe into the charging unit, and flow from the charging unit to the water outlet pipe. Heat of the N charging unit is concentrated to the water cooler by the flow of the coolant.

Figure 17:
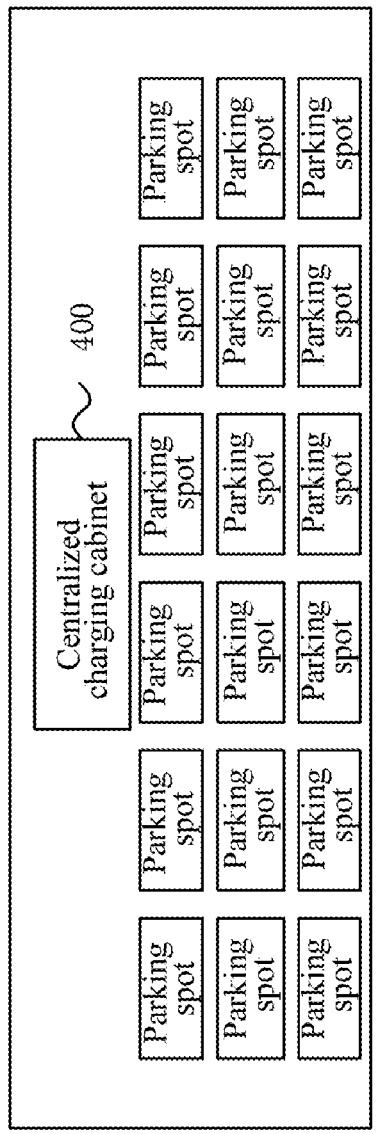
FIG. 17 is a layout diagram of a charging station established according to a centralized charging cabinet provided by the present disclosure.

FIG. 17 is a layout diagram of a charging station established according to a centralized charging cabinet provided by the present disclosure. As shown in FIG. 17, the charging cabinet is arranged on a side of the charging station site. The rest of the charging station can be planned as parking spots for charging the electric vehicles. Since the centralized charging cabinet is used in the embodiment, a same land area can accommodate more parking spots.

Figure 18:
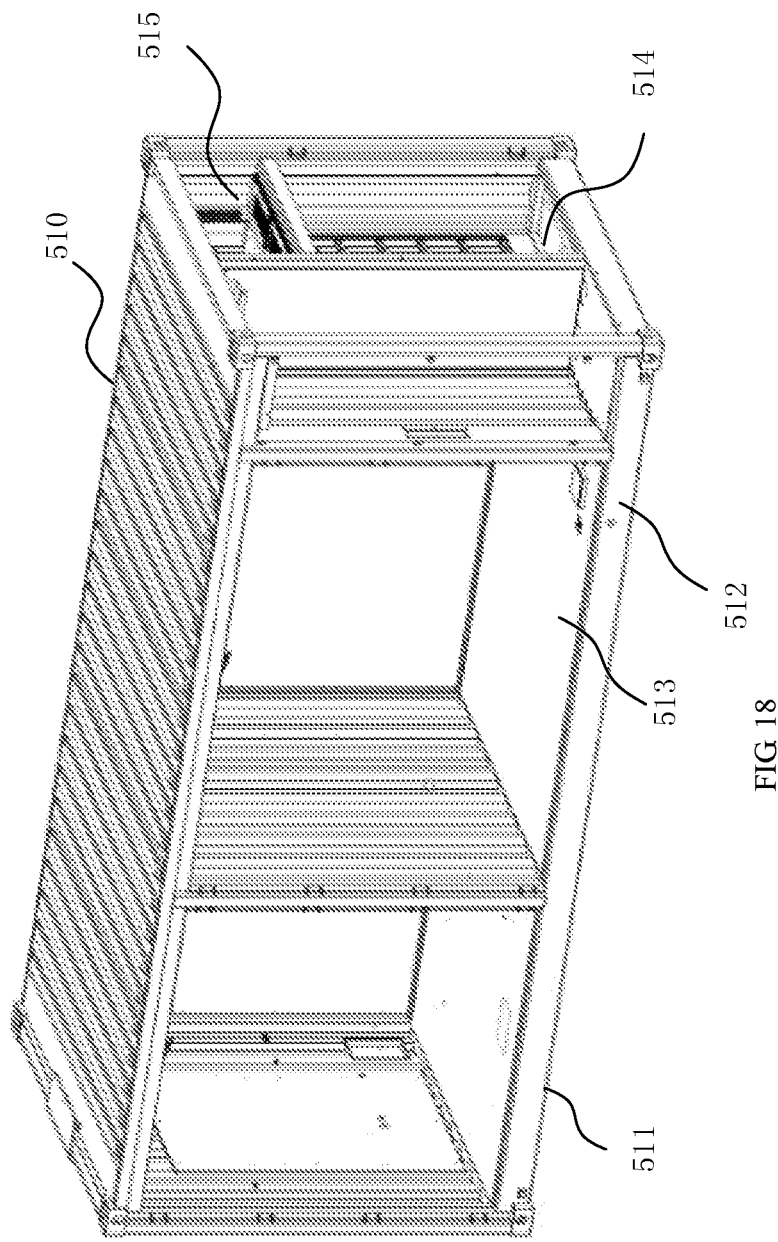
FIG. 18 is a schematic structural diagram of a cabinet provided by the present disclosure.

The centralized charging cabinet provided by another exemplary embodiment of the present disclosure includes a charging cabinet, an isolation transformer, a charging unit, a power distribution unit, an auxiliary power supply, a monitoring unit, and a heat dissipation system. Among them, the monitoring unit includes: a monitor and a communication module. The heat dissipation system also includes: a water-cooled pipe, a water-cooler and cooling fan. FIG. 18 is a schematic structural diagram of a cabinet provided by the present disclosure. As shown in FIG. 18, the cabinet 510 is provided with an isolation area 511 and a charging area 512. The charging area 512 includes a power module compartment 513, a power distribution compartment 514, and a control compartment 515. The isolation transformer is located in the isolation area 511, the charging unit is located in the power module compartment 513, the power distribution unit is placed in the power distribution compartment 514, and the auxiliary power supply, the monitor, and the communication module are placed in the control compartment 515. The water cooler is provided on the edge of the cabinet to facilitate convective heat dissipation with air. The isolation area 511 and the power module compartment 513 are respectively equipped with a cooling fan.

In this embodiment, the specific process of installing the centralized charging cabinet may be: according to a preset installation sequence, sequentially placing each component in the cabinet, and then connecting the components to facilitate assembly. For example, the first installation sequence is: the isolation transformer and the charging unit, the isolation transformer is placed in the isolation area 511, the charging unit is placed in the power module compartment 513, and the isolation transformer and the charging unit are connected through a wiring busbar. The second installation sequence is: the power distribution unit. The power distribution unit is placed in the power distribution compartment 514, and the power distribution unit and the charging unit are connected through a wiring busbar. The third installation sequence is: the auxiliary power supply, the monitor and the communication module. Then placing the auxiliary power supply, the monitor and the communication module in the control compartment 515, and connecting the control line. The fourth step is to lay the water-cooled pipe in the cabinet and connect the water cooler.

At the beginning of the design of the centralized charging cabinet, considering three aspects of heat dissipation, safety regulations and convenience of assembly after centralizing, the cabinet is reasonably designed, the cabinet is divided into several areas, the isolation transformer is placed in the isolation area, and the charging unit and other components are placed in various compartments in the charging area. Through the division of multiple compartments, the heat dissipation of the components inside the cabinet is relatively independent, the heat between them does not overlap, there is no local overheating problem, and the heat dissipation problem after centralizing is well solved. In addition, if the isolation transformer is a medium voltage transformer, there will be two voltage levels of medium voltage and low voltage in the entire cabinet. The isolation of medium voltage and low voltage depends on the isolation transformer on the one hand, on the other hand, it depends on the area division of the cabinet and the division of the compartment to limit the medium voltage and low voltage to different areas. Installation and maintenance personnel perform independent maintenance operation in different areas during maintenance operations to improve safety performance.

In the centralized charging cabinet according to this embodiment, when many vehicles are required to be charged, the centralized charging cabinet further includes the monitoring unit, the auxiliary power supply and the heat dissipation system. The monitoring unit monitors the state of the charging cabinet, the isolation transformer and the charging unit, to realize protection of the charging cabinet. The heat dissipation system is used to centrally dissipate the charging unit, which has high heat dissipation efficiency.

In the centralized charging cabinet according to the present disclosure, the isolation area and the charging area are provided inside the charging cabinet, the isolation transformer is provided in the isolation area, and the charging unit is provided in the charging area, which achieves a centralized layout of the isolation transformer and the charging unit and improves the space utilization and the power density of the charging cabinet, and reduces the design requirement of the casing of the charging unit. Dividing the charging area into the back region and the front region and disposing a power line connecting the isolation transformer and the charging unit in the back region achieves high-voltage area isolation and improves safety of the centralized charging cabinet.

In the centralized charging cabinet according to the present disclosure, the quick-connect terminals are provided at the rear of the charging control module and each charging module, and the corresponding quick-connect terminals are connected by using the connecting busbar, thereby connection between the charging control module and each charging module in the charging area is realized, which improves space utilization. And the quick-connect terminals of the charging control module and each charging module are all provided at the rear end, so that both the quick-connect terminal and the connecting busbar are located at the back region of the charging area, which achieves high-voltage area isolation and improves the safety of the centralized charging cabinet.

In the centralized charging cabinet according to the present disclosure, the energy storage unit is further provided. The energy storage unit is connected to an external power supply. When the power of the power distribution network is insufficient, the energy storage unit and the external power supply can provide charging power for the charging equipment, and when the power of the power distribution network is sufficient, the power of the power distribution network is stored into the external power supply through the energy storage unit, which realizes the integrated charging and storage system and reduces the burden on the power network.

Finally, it should be noted that the above embodiments are only for explaining, instead of limiting, the technical solutions of the present disclosure. Although the present disclosure has been described in detail with reference to the foregoing embodiments, those skilled in the art should understand that the technical solutions described in the foregoing embodiments may still be modified, or some or all of the technical features may be equivalently replaced, and the modifications or substitutions do not make the essence of the corresponding technical solutions deviate from the scope of the technical solutions of the embodiments of the present disclosure.

What is claimed is:

1. A centralized charging cabinet, comprising:
   a charging cabinet, provided with an isolation area and a charging area therein;
   an isolation transformer, provided in the isolation area; and
   at least one charging unit, provided in the charging area, wherein each of the charging unit is electrically connected to a secondary winding of the isolation transformer through a plurality of first connection structures, and the plurality of first connection structures are located at a back region of the charging area;
   wherein the charging unit comprises: a charging control module and M charging module, wherein the charging control module is electrically connected to the M charging module;
   a first row of quick-connect terminals is provided at a rear end of each of the M charging module;
   a second row of quick-connect terminals and a third row of quick-connect terminals are provided at a rear end of the charging control module;
   wherein the first row of quick-connect terminals is connected to the second row of quick-connect terminals in one-to-one correspondence, and corresponding quick-connect terminals are connected through a connecting busbar, wherein the first row of quick-connect terminals, the second row of quick-connect terminals, the third row of quick-connect terminals and the connecting busbar are all located at the back region of the charging area; and
wherein M is a positive integer greater than or equal to one.

2. The centralized charging cabinet according to claim 1, wherein the third row of quick-connect terminals comprises: a plurality of input terminals and a plurality of output terminals;
wherein the plurality of input terminals are connected to an end of the plurality of first connection structures in one-to-one correspondence.

3. The centralized charging cabinet according to claim 2, wherein:
a power distribution unit, which is configured to electrically connect to an external charging equipment, is further provided in the charging area;
wherein the charging unit is electrically connected to the power distribution unit through a plurality of second connection structures, and the plurality of second connection structures are located at the back region of the charging area.

4. The centralized charging cabinet according to claim 3, wherein:
the plurality of output terminals of the third row of quick-connect terminals are connected to an end of the plurality of second connection structures in one-to-one correspondence, and the second connection structure is electrically connected to the power distribution unit through a second connection line, to realize electrical connection between the charging unit and the power distribution unit;
wherein the second connection line is connected to the power distribution unit along a bottom side of the charging cabinet, to realize electrical connection with the second connection structure.

5. The centralized charging cabinet according to claim 1, wherein:
a primary winding of the isolation transformer is provided at a front region of the isolation area and connected to a power distribution network; and
the secondary winding of the isolation transformer is provided at a back region of the isolation area.

6. The centralized charging cabinet according to claim 2, wherein:
the secondary winding of the isolation transformer is electrically connected to the first connection structure through a first connection line, to realize electrical connection between the charging unit and the secondary winding of the isolation transformer;
wherein the first connection line enters the charging area from the isolation area along a top side of the charging cabinet, to realize electrical connection with the first connection structure.

7. The centralized charging cabinet according to claim 3, wherein at least one energy storage unit is further provided in the charging area;
wherein each of the energy storage unit is electrically connected to the secondary winding of the isolation transformer through a plurality of third connection structures, each of the energy storage unit is further electrically connected to the power distribution unit through a plurality of fourth connection structures, and the energy storage unit is electrically connected to an external battery through the power distribution unit; and
the plurality of third connection structures and the plurality of fourth connection structures are respectively located at the back region of the charging area.

8. The centralized charging cabinet according to claim 7, wherein the external battery is one battery having a capacity exceeding a first threshold, one energy storage unit having a capacity exceeding a second threshold is provided in the charging area, and the energy storage unit is correspondingly connected to the battery through the power distribution unit; or
the external battery is a plurality of batteries having a capacity smaller than a third threshold, a plurality of energy storage units having a capacity smaller than a fourth threshold is provided in the charging area, and the plurality of energy storage units are electrically connected to the plurality of batteries in one-to-one correspondence through the power distribution unit.

9. The centralized charging cabinet according to claim 7, wherein the energy storage unit comprises an energy storage control module and L energy storage module, wherein the energy storage control module is electrically connected to each of the L energy storage module;
a fourth row of quick-connect terminals are provided at a rear end of each of the L energy storage module;
a fifth row of quick-connect terminals and a sixth row of quick-connect terminals are provided at a rear end of the energy storage control module;
wherein the fourth row of quick-connect terminals is connected to the fifth row of quick-connect terminals in one-to-one correspondence, and corresponding quick-connect terminals are connected through a connecting busbar, wherein the fourth row of quick-connect terminals, the fifth row of quick-connect terminals, the sixth row of quick-connect terminals and the connecting busbar are all located at the back region of the charging area; and
wherein L is a positive integer greater than or equal to one.

10. The centralized charging cabinet according to claim 9, wherein the sixth row of quick-connect terminals comprises a plurality of input terminals and a plurality of output terminals, wherein the plurality of input terminals are connected to an end of the plurality of third connection structures in one-to-one correspondence, and the plurality of output terminals are connected to an end of the plurality of fourth connection structures in one-to-one correspondence;
the secondary winding of the isolation transformer is electrically connected to the other end of the third connection structure through a third connection line, and the third connection line enters the charging area from the isolation area along a top side of the charging cabinet; and
the fourth connection structure is connected to the power distribution unit through a fourth connection line, and the fourth connection line is connected to the power distribution unit along a bottom side of the charging cabinet.

11. The centralized charging cabinet according to claim 1, wherein an auxiliary area is further provided in the charging cabinet, and at least one of an auxiliary power supply and a monitoring unit is provided in the auxiliary area;
wherein the monitoring unit comprises a monitor and a communication module;
the auxiliary power supply is electrically connected to the secondary winding of the isolation transformer; or, the auxiliary power supply is electrically connected to the secondary winding of the isolation transformer, the monitor and the communication module, respectively;

the monitor is electrically connected to the at least one charging unit and the communication module, respectively; and the communication module is electrically connected to an external central control management platform.

12. The centralized charging cabinet according to claim 11, wherein:

the isolation transformer is connected to a power distribution network through a power distribution cabinet; and the monitor is connected to the power distribution cabinet, and is used to acquire a state of a door of the isolation area and send a disconnection instruction to the power distribution cabinet to disconnect electrical connection between the power distribution network and the centralized charging cabinet when the state is determined to be an abnormally open state.

13. The centralized charging cabinet according to claim 1, wherein a heat dissipation fan and a control module are provided in the charging control module, and the heat dissipation fan is provided on a front panel of the charging control module.

14. The centralized charging cabinet according to claim 1, wherein the centralized charging cabinet further comprises:

a water cooler;

a main water inlet pipe, a main water outlet pipe, a least one branch water inlet pipe and at least one branch water outlet pipe are provided in the centralized charging cabinet, and two heat dissipation ports are provided on each of the M charging module;

wherein an output end of the water cooler is connected to the main water inlet pipe, and an input end of the water cooler is connected to the main water outlet pipe; and each of the branch water inlet pipe is connected to the main water inlet pipe, each of the branch water outlet pipe is connected to the main water outlet pipe, and the two heat dissipation ports of each of the M charging module are connected to one branch water outlet pipe and one branch water inlet pipe, respectively.

* * * * *